United States Patent
Seo et al.

(10) Patent No.: US 11,379,187 B2
(45) Date of Patent: Jul. 5, 2022

(54) SEMICONDUCTOR DEVICE PERFORMING A MULTIPLICATION AND ACCUMULATION OPERATION

(71) Applicants: SK hynix Inc., Icheon (KR); Korea Advanced Institute of Science and Technology (KAIST), Daejeon (KR)

(72) Inventors: Jin-O Seo, Uiwang (KR); Hyuk-Jin Lee, Suwon (KR); SeongHwan Cho, Daejeon (KR)

(73) Assignees: SK hynix Inc., Icheon (KR); Korea Advanced Institute of Science and Technology (KAIST), Daejeon (KR)

( * ) Notice: Subject to any disclaimer, the term of this patent is extended or adjusted under 35 U.S.C. 154(b) by 81 days.

(21) Appl. No.: 16/834,706

(22) Filed: Mar. 30, 2020

(65) Prior Publication Data
US 2021/0089273 A1    Mar. 25, 2021

(30) Foreign Application Priority Data

Sep. 20, 2019  (KR) ........................ 10-2019-0115719

(51) Int. Cl.
| G06F 7/544 | (2006.01) |
| G06F 7/523 | (2006.01) |
| G11C 11/4096 | (2006.01) |
| G06N 3/04 | (2006.01) |

(52) U.S. Cl.
CPC ............ *G06F 7/5443* (2013.01); *G06F 7/523* (2013.01); *G11C 11/4096* (2013.01); *G06N 3/04* (2013.01)

(58) Field of Classification Search
CPC .................. G06F 7/5443; G06F 17/16; G11C 11/00–5692; G06N 3/06; G06N 3/063; G06N 3/0635
See application file for complete search history.

(56) References Cited

U.S. PATENT DOCUMENTS

| 9,692,997 | B2 | 6/2017 | Hseih et al. |
| 10,055,383 | B1 * | 8/2018 | Shafiee Ardestani ....................... G11C 13/0023 |
| 10,056,386 | B2 * | 8/2018 | Mathew .............. H01L 29/1037 |
| 10,642,922 | B2 * | 5/2020 | Knag ....................... G06G 7/16 |
| 2016/0232951 | A1 * | 8/2016 | Shanbhag ................ G11C 7/16 |
| 2017/0300148 | A1 * | 10/2017 | Shimada ............. G06F 3/04166 |
| 2019/0042199 | A1 | 2/2019 | Sumbul et al. |

(Continued)

OTHER PUBLICATIONS

K. Sanni, T. Figliolia, G. Tognetti, P. Pouliquen and A. Andreou, "A Charge-Based Architecture for Energy-Efficient Vector-Vector Multiplication in 65nm CMOS," 2018 IEEE International Symposium on Circuits and Systems (ISCAS), 2018, pp. 1-5, doi: 10.1109/ISCAS.2018.8351274. (Year: 2018).*

*Primary Examiner* — Emily E Larocque
*Assistant Examiner* — Carlo Waje

(57) ABSTRACT

A semiconductor device includes a cell array, a computation circuit, and a control circuit. The cell array includes a plurality of unit cells configured to store a plurality of first signals by a write operation and to output a plurality of output signals corresponding to the first signals by a read operation. The computation circuit includes a plurality of unit computation circuits receiving the plurality of output signals and being set according to a plurality of second signals during a computation operation. The control circuit is configured to control the cell array and the computation circuit during the write operation, the read operation, and the computation operation.

13 Claims, 5 Drawing Sheets

(56) References Cited

U.S. PATENT DOCUMENTS

| | | | |
|---|---|---|---|
| 2019/0102359 A1* | 4/2019 | Knag ........................ | G06G 7/22 |
| 2019/0147924 A1* | 5/2019 | Bringivijayaraghavan | ................. |
| | | | H04L 5/22 |
| | | | 365/203 |
| 2020/0160157 A1* | 5/2020 | Kim ...................... | G06N 3/0635 |
| 2020/0193277 A1* | 6/2020 | Kwon ................... | G06F 7/5443 |
| 2020/0194433 A1* | 6/2020 | Bennett ................. | G11C 11/565 |
| 2020/0242190 A1* | 7/2020 | McCollum ............... | G06N 3/04 |
| 2020/0356620 A1* | 11/2020 | Yen ......................... | G06F 17/16 |
| 2020/0410040 A1* | 12/2020 | Lee ....................... | G11C 11/565 |
| 2022/0012581 A1* | 1/2022 | Sharma .................. | G11C 11/54 |

\* cited by examiner

SEMICONDUCTOR DEVICE PERFORMING A MULTIPLICATION AND ACCUMULATION OPERATION

CROSS-REFERENCE TO RELATED APPLICATION

The present application claims priority under 35 U.S.C. § 119(a) to Korean Patent Application No. 10-2019-0115719, filed on Sep. 20, 2019, which is incorporated herein by reference in its entirety.

BACKGROUND

1. Technical Field

Various embodiments relate to a semiconductor device performing a multiplication and accumulation (MAC) operation.

2. Related Art

Neural networks are widely used in artificial intelligence applications, such as image recognition and technologies used in autonomous vehicles.

In an example, a neural network includes an input layer, an output layer, and one or more inner layers between the input layer and the output layer.

Each of the output layer, the input layer, and the inner layers includes one or more neurons. Neurons contained in adjacent layers are connected in various ways through synapses. For example, synapses point from neurons in a given layer to neurons in a next layer. Alternately or additionally, synapses point to neurons in a given layer from neurons in a previous layer.

Each of the neurons stores a value. The values of the neurons included in the input layer are determined according to an input signal, for example, an image to be recognized. The values of the neurons contained in the inner and output layers are based on the neurons and synapses contained in corresponding previous layers. For example, the values of the neurons in each of the inner layers are based on the values of the neurons in a preceding layer in the neural network.

Each of the synapses has a weight. The weight of each of the synapses is based on a training operation of the neural network.

After the neural network is trained, the neural network can be used to perform an inference operation. In the inference operation, the values of the neurons in the input layer are set based on an input, and the values of the neurons in the next layers (e.g., the inner layers and the output layer) are set based on the values of the neurons in the input layer and the trained synapses connecting the layers. The values of the neurons in the output layer represent a result of the inference operation.

For example, in an inference operation, in which image recognition is performed by the neural network after the neural network has been trained, the values of the neurons in the input layer are set based on an input image, a plurality of operations are performed at the inner layers based on the values of the neurons in the input layer, and a result of the image recognition is output at the output layer from the inner layers.

In such an inference operation, a large number of Multiply-Accumulate (MAC) operations must be performed by the neurons in the convolutional neural network. As a result, a semiconductor device that can efficiently perform a large number of MAC operations is desired.

SUMMARY

In accordance with an embodiment of the present disclosure, a semiconductor device may include a cell array including a plurality of unit cells configured to store a plurality of first signals by a write operation and to output a plurality of output signals corresponding to the first signals by a read operation; a computation circuit including a plurality of unit computation circuits receiving the plurality of output signals and being set according to a plurality of second signals during a computation operation; and a control circuit configured to control the cell array and the computation circuit during the write operation, the read operation, and the computation operation.

In accordance with an embodiment of the present disclosure, a method of performing a computation operation may include storing a first plurality of analog voltage values respectively corresponding to a first plurality of input values in a first row of a cell array; and performing a first computation by: performing a first multiplication operation by: configuring capacitances of a plurality of unit computation circuits according to a plurality of weight values, respectively, and charging the configured capacitances of the plurality of unit computation circuits according to the first plurality of analog voltage values; and after performing the first multiplication operation, performing a first accumulation operation by: configuring the respective capacitances of the plurality of unit computation circuits to have a same value, connecting the capacitances of the plurality of unit computation circuits together in parallel, and outputting a first computation result according to a voltage of the connected capacitances.

BRIEF DESCRIPTION OF THE DRAWINGS

The accompanying figures, wherein like reference numerals refer to identical or functionally similar elements throughout the separate views, together with the detailed description below, are incorporated in and form part of the specification, and serve to further illustrate embodiments that include various features, and explain various principles and beneficial aspects of those embodiments.

DETAILED DESCRIPTION

Various embodiments will be described below with reference to the accompanying figures. Embodiments are provided for illustrative purposes and other embodiments that are not explicitly illustrated or described are possible. Further, modifications can be made to embodiments of the present disclosure that will be described below in detail.

Figure 1:
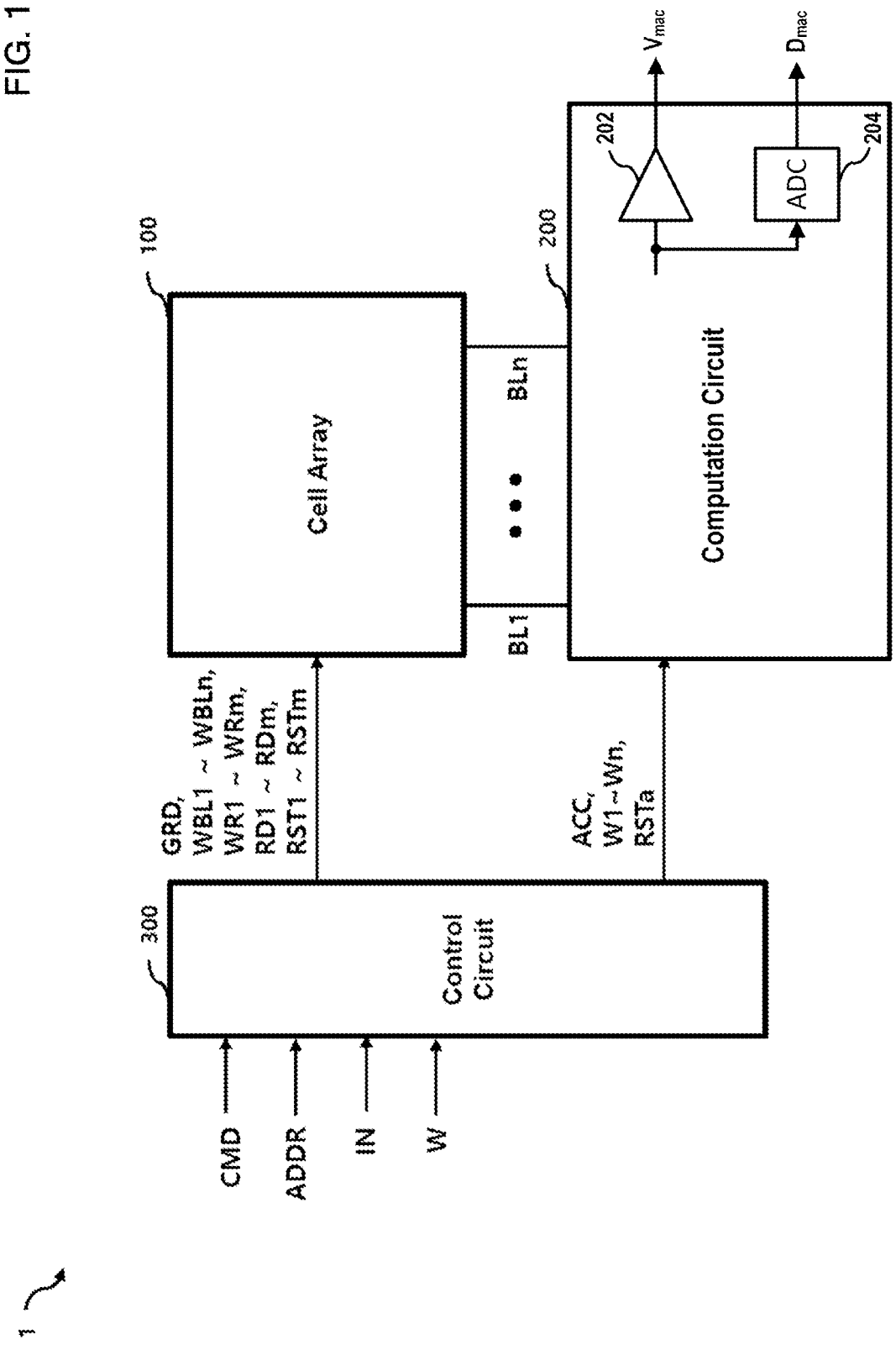
FIG. 1 illustrates a semiconductor device according to an embodiment of the present disclosure.

FIG. 1 illustrates a semiconductor device 1 according to an embodiment of the present disclosure.

The semiconductor device 1 includes a cell array 100, a computation circuit 200, and a control circuit 300.

The cell array 100 includes a plurality of unit cells capable of storing analog signals. The plurality of unit cells may be arranged in a grid form.

The computation circuit 200 performs an operation corresponding to an inner product of an input vector and a weight vector and outputs a result thereof.

The structure and operation of the cell array 100 and the computation circuit 200 will be described in detail with reference to FIG. 2.

The control circuit 300 controls the cell array 100 and the computation circuit 200 according to a command CMD, an address ADDR, an input signal IN, and a weight signal W. The address can include a row address and a column address.

In the present embodiment, the input signal and the weight signal may be referred to as an input vector and a weight vector, and each includes a plurality of elements. Each element of the input vector and weight vector in the illustrated embodiment is a multi-bit digital signal.

The present embodiment is disclosed assuming that a signal corresponding to an input signal IN is stored in the cell array 100 and a weight signal W is provided to the computation circuit 200.

In another embodiment, a signal corresponding to the weight signal may be stored in the cell array 100, and a signal corresponding to the input signal may be provided to the computation circuit 200.

The signal provided to the cell array 100 may be referred to as a first signal, and the signal provided to the computation circuit 200 may be referred to as a second signal.

Accordingly, a signal stored in the cell array 100 corresponding to the first signal may be referred to as a first analog signal.

The control circuit 300 controls the operation of storing an analog signal corresponding to the input signal in the cell array 100 and the operation of reading the stored analog signal from the cell array 100.

Hereinafter, an operation of storing an analog signal corresponding to an input signal in the cell array 100 is referred to as a write operation, and an operation of reading the stored analog signal and outputting the stored analog signals to the bitlines BL1 to BLn is referred to as a read operation.

The control circuit 300 provides row write signals WR1, . . . , WRm, column write signals WBL1, . . . , WBLn, row reset signals RST1, . . . , RSTm, row read signals RD1, . . . , RDm, and a global read signal GRD to the cell array 100 in order to control read or write operations.

A read operation, a write operation, and characteristics of signals required for each operation will be described in detail with reference to FIG. 2.

The control circuit 300 controls the operation of the computation circuit 200.

In the present embodiment, the operation performed by the computation circuit 200 includes a MAC operation including a plurality of multiplication operations and a plurality of accumulation operations performed using results of the multiplication operations to calculate an inner product between an input vector and a weight vector.

In order to perform a multiplication operation, a read operation is performed to read a row of the cell array 100 corresponding to a row address.

As a result of the accumulation operations, a computation signal $V_{mac}$ corresponding to the inner product between the input vector and the weight vector is output.

The control circuit 300 may provide switch control signals W1, . . . , Wn, an accumulation signal ACC, and a discharge signal RSTa to the computation circuit 200 for a computation operation.

A computation operation and characteristics of a signal required for the computation operation will be described in detail with reference to FIG. 2.

Figure 2:
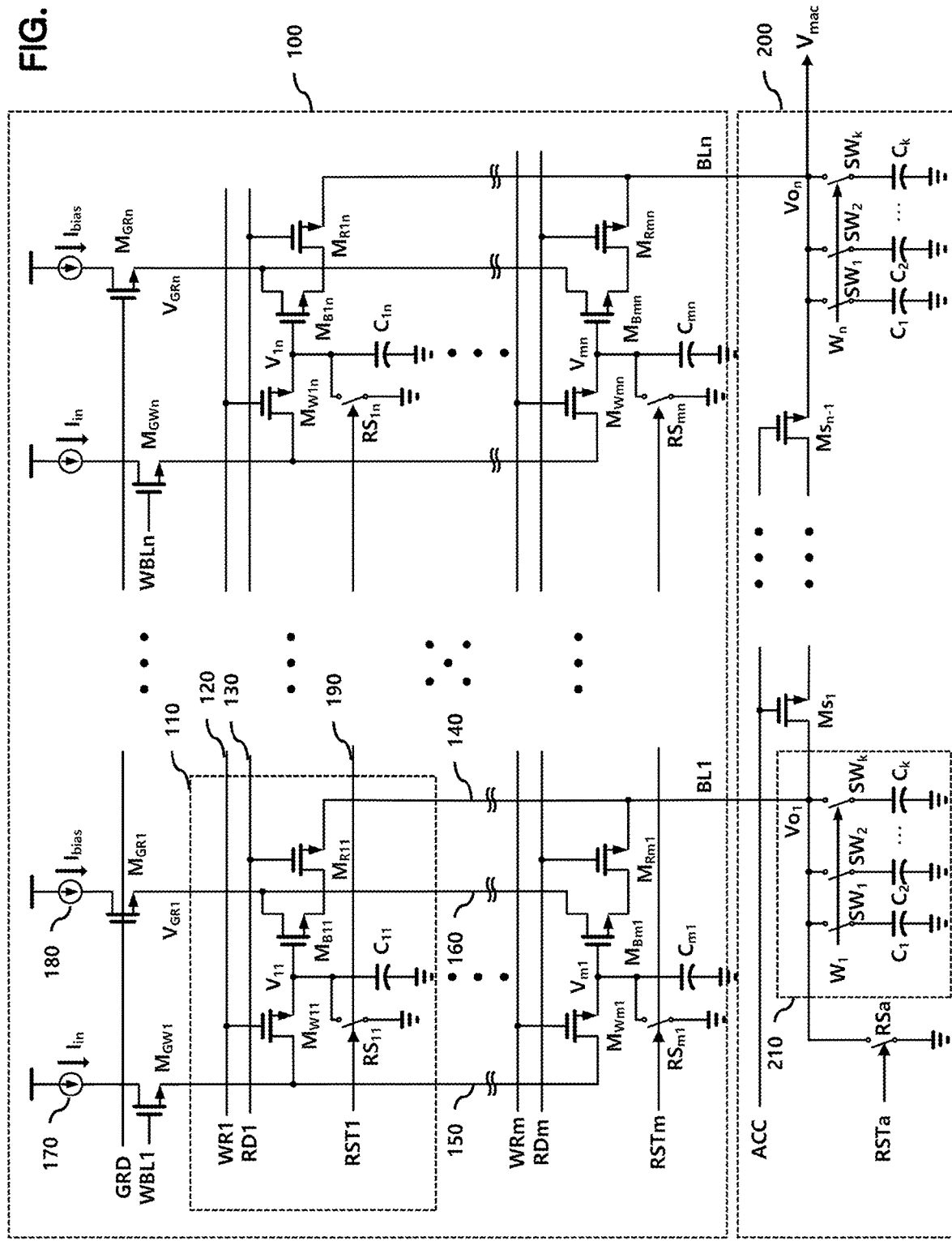
FIG. 2 illustrates a computation circuit according to an embodiment of the present disclosure.

FIG. 2 illustrates a cell array 100 and a computation circuit 200 according to an embodiment of the present disclosure.

The cell array 100 includes a plurality of unit cells 110 arranged in a grid form.

The plurality of unit cells 110 are arranged in a grid having m rows and n columns, where each of m and n is a natural number greater than 1. Each of the plurality of unit cells 110 have the same internal configuration.

Hereinafter, a unit cell 110 located at an intersection of a first row and a first column will be described.

The cell array 100 includes a plurality of write wordlines 120 arranged in a row direction, a plurality of read wordlines 130 arranged in the row direction, and a plurality of bitlines 140 arranged in a column direction.

The cell array 100 includes a plurality of write bitlines 150 and a plurality of read bitlines 160 arranged in the column direction.

The cell array 100 includes a plurality of input current sources 170 each provides an input current $I_{in}$ to a corresponding write bitline 150.

The cell array 100 includes a plurality of bias current sources 180 each provides a bias current $I_{bias}$ to a corresponding read bitline 160.

The cell array 100 includes a column write switch $M_{GW1}$ connecting the input current source 170 and the write bitline 150 according to the column write signal WBL1.

The cell array 100 includes a column read switch $M_{GR1}$ connecting the bias current source 180 and the read bitline 160 according to the global read signal GRD.

The cell array 100 may further include a plurality of reset lines 190 arranged in a row direction.

The analog signal stored in the unit cell 110 may be initialized according to a row reset signal RST1 applied to the reset line 190.

The unit cell 110 includes a cell capacitor $C_{11}$ that stores an analog signal. A first terminal of the cell capacitor $C_{11}$ is grounded.

The unit cell 110 includes a write circuit that stores an analog signal in the cell capacitor $C_{11}$ and a read circuit that reads the analog signal stored in the cell capacitor $C_{11}$.

The write circuit includes a write transistor $M_{W11}$ having a source connected to the a second terminal of the cell capacitor $C_{11}$, a gate connected to the write wordline 120, and a drain connected to the write bitline 150.

The read circuit includes a first read transistor $MB_{11}$ having a gate connected to the second terminal of the cell capacitor $C_{11}$ and a drain connected to the read bitline 160 and a second read transistor $M_{R11}$ having a gate connected to a read wordline 130, a drain connected to a source of the first read transistor $MB_{11}$, and a source connected to the bitline 140.

The unit cell 110 further includes a cell reset switch $RS_{11}$ connected between the first and second terminals of the cell capacitor $C_{11}$ and discharging the cell capacitor $C_{11}$ according to the row reset signal RST1 transmitted through the reset line 190.

When the write operation is performed, the row write signal WR1 and the column write signal WBL1 are activated.

In this embodiment, the row write signal WR1 is activated while a write operation on the corresponding row is in progress.

The column write signal WBL1 is a pulse signal having a width corresponding to the value of the corresponding element of the input vector.

In the period when both the row write signal WR1 and the column write signal WBL1 are at a high level, the cell capacitor $C_{11}$ is charged by the input current $I_{in}$ provided through the write transistor $M_{W11}$.

Accordingly, the cell voltage $V_{11}$ charged in the cell capacitor $C_{11}$ by the write operation is, at the end of the pulse on the column write signal WBL1, an analog signal having a voltage value corresponding to the value of the corresponding element of the input vector.

At this time, the cell voltage $V_{11}$ should be set to a value high enough that the first read transistor $M_{B11}$ can operate in the saturation region, and thus the cell voltage $V_{11}$ should be higher than the threshold voltage $V_{th11}$ of the first read transistor $M_{B11}$.

In the present embodiment, the row reset signal RST1 may be activated to discharge and initialize the cell capacitors $C_{11}, \ldots, C_{1n}$ included in the corresponding row before the write operation is performed.

When the read operation is performed, the global read signal GRD and the row read signal RD1 are activated.

The global read signal GRD has a high level while a read operation is performed on any of the rows.

The row read signal RD1 has a high level while performing a read operation on the corresponding row.

During the read operation, the bias current $I_{bias}$ is provided to the drain of the first read transistor $M_{B11}$.

In this case, the bias current $I_{bias}$ corresponds to a value at which the first read transistor $M_{B11}$ can operate in a saturation region so that the source voltage of the first read transistor $M_{B11}$ can follow the cell voltage $V_{11}$ provided to the gate thereof.

The second read transistor $M_{R11}$ is turned on by the row read signal RD1, but the magnitude of the row read signal RD1 is set such that the source voltage of the second read transistor $M_{R11}$ substantially follows the drain voltage thereof.

Accordingly, in the read operation, an output voltage $V_{O1}$ having substantially the same magnitude as the cell voltage $V_{11}$ is produced on the bitline BL1.

The read operation is performed on the plurality of columns included in the row, thereby a plurality of output voltages $V_{O1}, \ldots, V_{On}$ are provided from the plurality of bitlines BL1, ..., BLn.

The computation circuit 200 includes a plurality of unit computation circuits 210 respectively corresponding to the plurality of bitlines in the cell array 100. Each of the plurality of unit computation circuits 210 have substantially the same internal configuration.

Hereinafter, the internal configuration of the unit computation circuit 210 connected to the first bitline BL1 is disclosed.

A first terminal of the unit computation circuit 210 is connected to the corresponding bitline BL1 and a second terminal is grounded. The first terminal of the unit computation circuit 210 may be referred to as an output terminal of the unit computation circuit 210.

Each of the plurality of unit computation circuits 210 performs a multiplication operation. For example, the unit computation circuit 210 charges an amount of charge corresponding to a product of an element of the input vector and an element of the weight vector.

That is, information stored in the unit computation circuit 210 corresponding to an element of the weight vector may be represented as a capacitance of the unit computation circuit 210.

The output terminal of the unit computation circuit 210 is connected to the output terminal of the adjacent unit computation circuit through the connection switch $M_{S1}$.

The plurality of connection switches $M_{S1}$ are turned on or off according to the accumulation signal ACC, and when the accumulation signal ACC is activated, the plurality of unit computation circuits are all connected in parallel so that the computation signal $V_{mac}$ is output at the output terminal of the unit computation circuit 210.

The unit computation circuit 210 includes k switch-capacitor pairs, where k is a natural number greater than 1, connected in parallel between the first terminal and the second terminal of the unit computation circuit 210.

In an embodiment, the number k of switch-capacitor pairs corresponds to the number of bits of an element of the weight vector, which corresponds to a number of bits of the switch control signal $W_1$.

Each switch-capacitor pair includes a switch SW; and a computation capacitor $C_j$ for j in 1 ... k, connected in series between the first terminal and the second terminal of the unit computation circuit 210.

In the present embodiment, capacitance of a computation capacitor $C_j$ included in the j-th switch-capacitor pair may be represented by $2^{j-1}C_P$, where $C_P$ is a unit capacitance having a predetermined capacitance. In another embodiment, each bit $W_{1j}$ of the switch control signal $W_1$ may control $2^{j-1}$ switch-capacitor pairs, each capacitor in the switch-capacitor pairs having the unit capacitance $C_p$.

The control circuit 300 controls the operation of the computation circuit 200.

In order to perform a computation operation, the switch control signal $W_1$ is used to control the plurality of switch-capacitor pairs of the unit computation circuit 210 coupled to the first bit line BL1, the switch control signal $W_2$ is used to control the plurality of switch-capacitor pairs of the unit computation circuit 210 coupled to the second bit line BL2, and so on, with the switch control signal $W_n$ used to control the plurality of switch-capacitor pairs of the unit computation circuit 210 coupled to the second bit line BLn, and so on, with.

As described above, the computation operation includes multiplication operations and accumulation operations.

The switch control signals W1 to $W_n$ are generated from the corresponding elements of the weight vector and respectively applied to the plurality of unit computation circuits 210 coupled to the plurality of bitlines BL1 to BLn for the multiplication operation.

After the read operation is performed in the cell array 100, the plurality of unit computation circuits are charged using the voltages $V_{O1}, \ldots, V_{On}$ produced on the plurality of bitlines BL1 to BLn.

As a result, each of the plurality of unit computation circuits stores charges whose amount corresponds to multiplication between an element of the input vector (corresponding to a voltage on a bitline) and an element of the weight vector (corresponding to a configured capacitance of a unit computation circuit).

In order to perform the accumulation operation, the cell array 100 terminates the read operation.

In addition, for the accumulation operation, the switch control signals $W_1, \ldots, W_n$ are controlled to set all of the capacitance of the plurality of unit computation circuits to be the same.

For example, the switch control signals $W_1, \ldots, W_n$ are each set to turn on all switches in the respective unit computation circuit 210. As a result, all unit computation circuits come to have the same capacitance $C_t$.

Thereafter, the accumulation signal ACC provided to the computation circuit 200 is activated to connect the plurality of unit computation circuits 210 in parallel.

When the addition signal ACC is activated, the charges stored in the plurality of unit computation circuits are redistributed, and as a result, the computation signal $V_{mac}$ provided at the output of the unit computation circuit 210 corresponds to the inner product of the input vector and the weight vector.

The computation circuit 200 may include a discharge switch RSa connected in parallel to the unit computation circuit 210.

The control circuit 300 may control the discharge operation with respect to the computation circuit 200 before starting the computation operation of the computation circuit 200.

In the discharge operation, all the switches of the plurality of unit computation circuits 210 may be turned on, the accumulation operation signal ACC may be activated, and the discharge signal RSTa may be activated.

Figure 3:
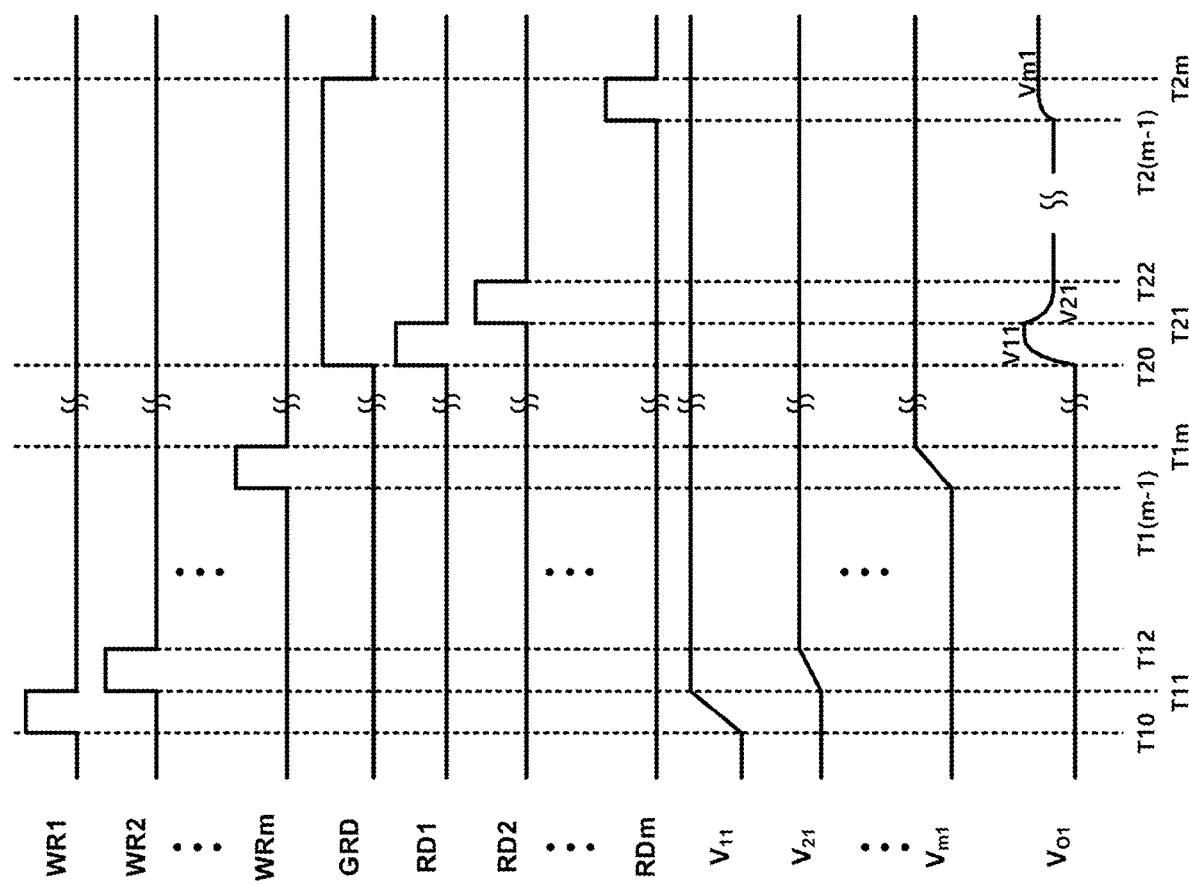
FIGS. 3, 4, and 5 respectively illustrates operations of a semiconductor device according to an embodiment of the present disclosure.

FIG. 3 is a timing diagram illustrating a write operation and a read operation with respect to the cell array 100.

Write operations are sequentially performed from the first row to the m-th row of the cell array 100 during T10 to T1$m$.

For example, the row write signal WR1 is activated during T10 to T11 to perform a write operation on the first row to store the cell voltage $V_{11}$, the row write signal WR2 is activated during T11 to T12 to perform a write operation on the second row to store the cell voltage $V_{21}$, and the row write signal WRm is activated during the period T1($m-1$) to T1$m$ to perform a write operation on the m-th row to store the cell voltage $V_{m1}$.

The cell voltage is only displayed for the first column, but the write operation may be performed on other columns to store the cell voltage. That is, in an embodiment, cell voltages $V_{11}$ to $V_{1n}$ may be respectively stored into cell capacitors $C_{11}$ to $C_{1n}$ when the row write signal WR1 is activated, cell voltages $V_{21}$ to $V_{2n}$ may be respectively stored into cell capacitors $C_{21}$ to $C_{2n}$ when the row write signal WR2 is activated, and so on.

The global read signal GRD is activated during the period between T20 and T2$m$ so that read operations are sequentially performed from the first row to the m-th row of the cell array 100.

For example, the row read signal RD1 is activated during T20 to T21 to perform a read operation on the first row, so that the output voltage $V_{O1}$ of the bitline BL1 becomes the cell voltage $V_{11}$.

The row read signal RD2 is activated during T21 to T22 to perform a read operation on the second row, so that the output voltage $V_{O1}$ of the bitline BL1 becomes the cell voltage $V_{21}$.

The row read signal RDm is activated during T2($m-1$) to T2$m$ to perform a read operation on the m-th row, so that the output voltage $V_{O1}$ of the bitline BL1 becomes the cell voltage $V_{m1}$.

Though only the output voltage $V_{O1}$ for the first column is shown, output voltages for other columns are also output. That is, when the global read signal GRD and the row read signal RDy are both activated, output voltages $V_{O1}$ to $V_{On}$ of the bitlines BL1 to BL$n$ become the cell voltages $V_{y1}$ to $V_{yn}$, respectively, for y in 1 . . . m.

Figure 4:
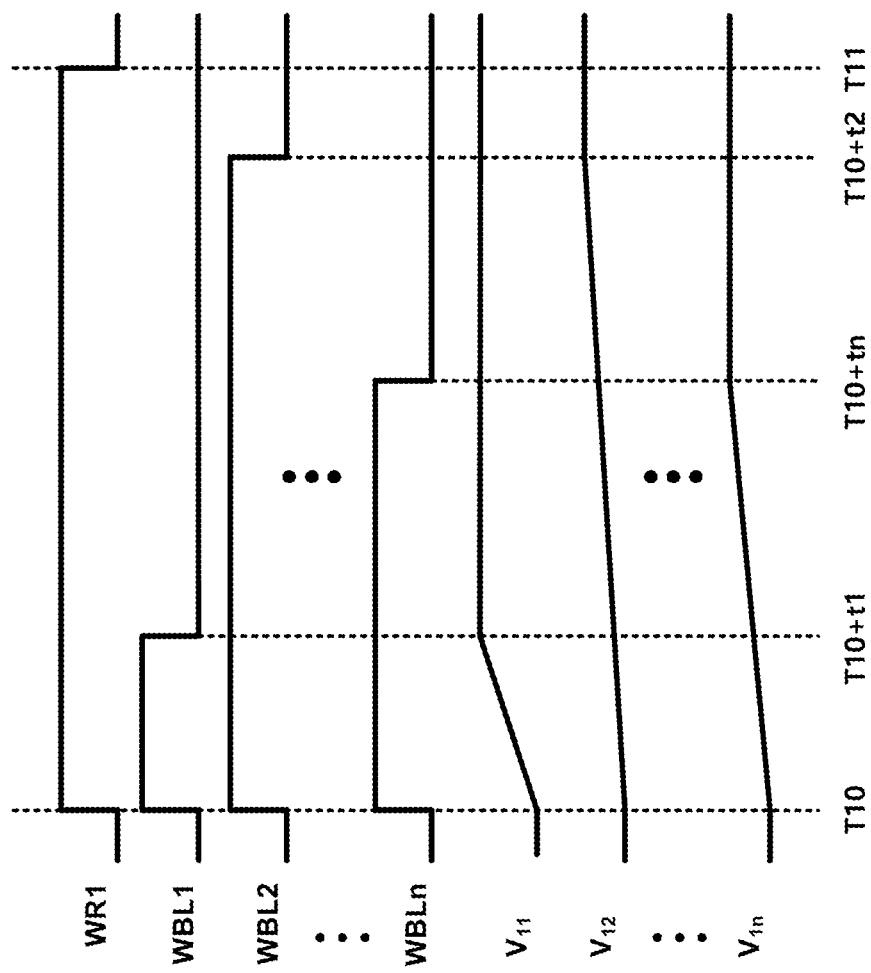

FIG. 4 is a timing diagram illustrating a write operation for each column during T10 to T11.

A write operation is performed for each column of the first row during T10 to T11.

As described above, each of the column write signals WBL1, . . . , WBL$n$ has a pulse width corresponding to the value of the corresponding element of the input vector.

For example, the column write signal WBL1 has a pulse width t1 and has a high level between T10 and T10+t1, and the column write signal WBL2 has a pulse width of t2 and has a high level between T10 and T10+t2. The column write signal WBL$n$ has a pulse width of t$n$ and has a high level between T10 and T10+t$n$.

Accordingly, the cell voltage $V_{11}$ gradually increases between T10 and T10+t1, the cell voltage $V_{12}$ gradually increases between T10 and T10+t2, and the cell voltage $V_{1n}$ gradually increases between T10 and T10+t$n$.

As described above, the cell voltage $V_{11}$ should be set to a value at which the first read transistor $M_{B11}$ can operate in the saturation region, so that the cell voltage $V_{11}$ should be higher than the threshold voltage $V_{th11}$ of the first read transistor $M_{B11}$.

The minimum length of the time when each of the column write signals WBL1 to WBL$n$ is activated may be set accordingly. That is, the pulse width of each of the column write signals WBL1 to WBL$n$ may correspond to the value of the corresponding element of the input vector plus an offset value corresponding to the threshold voltage of a read transistor.

Figure 5:
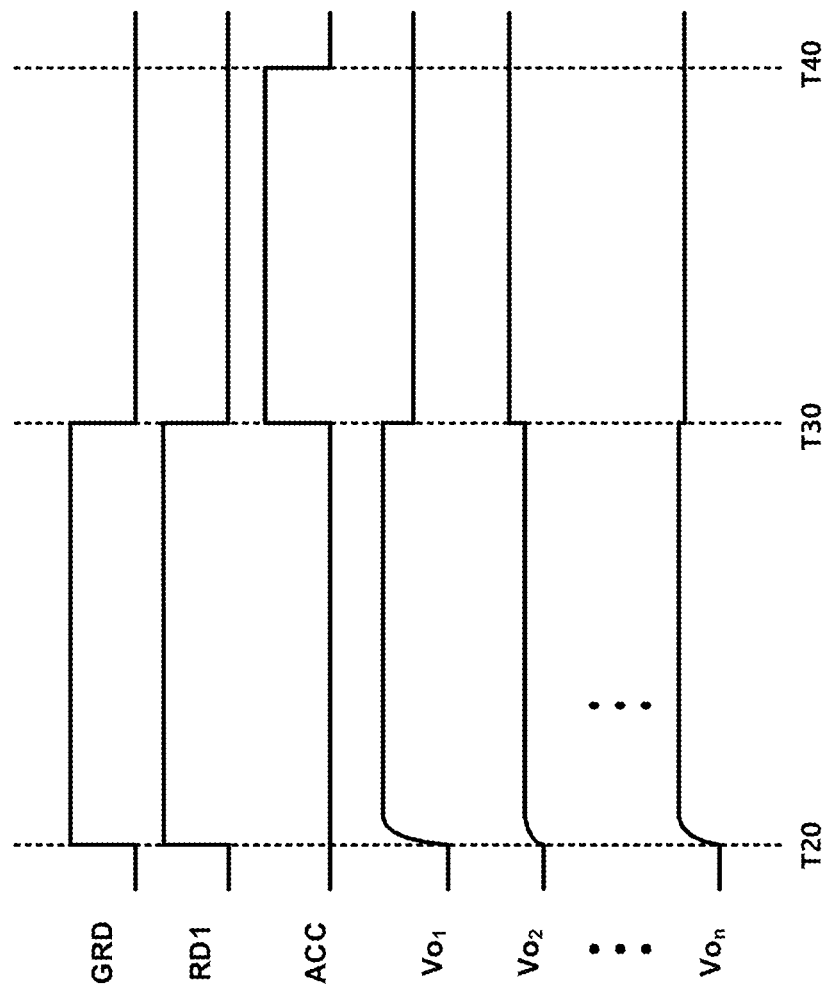

FIG. 5 is a timing diagram illustrating a computation operation for the first row.

The multiplication operation is performed between T20 and T30, and the accumulation operation is performed between T30 and T40.

In order to perform the multiplication operation, the computation circuit 200 provides switch control signals W1 to W$n$ corresponding to respective elements of the weight vector to set the respective capacitances of the plurality of unit computation circuit 210 to have values corresponding to the respective elements of the weight vector.

Thereafter, when the global read signal GRD and the row read signal RD1 are activated and the read operation for the first row is performed, the output voltages $V_{O1}$ to $V_{On}$ provided from the plurality of bitlines BL1 to BL$n$ are respectively applied to the unit computation circuits.

The charge amount $Q_j$ charged in the $j^{th}$ unit computation circuit, j in 1 . . . n, may be represented by the following equation 1.

$$Q_j = \sum_{i=1}^{k} (W_{ji} 2^{i-1} C_p) V_{11} = C_P V_{1j} W_j \qquad \text{[Equation 1]}$$

wherein k is the number of bits in the switch control signal $W_j$, and $W_{ji}$ is the value of the $i^{th}$ bit of switch control signal $W_j$.

In T30, the accumulation signal ACC is activated to connect the plurality of unit computation circuits 210 in parallel.

At this time, the switches included in the plurality of unit computation circuit are all turned on, and all the plurality of unit computation circuits come to have the same capacitance.

Accordingly, charges are redistributed among the plurality of unit computation circuits and a computation signal $V_{mac}$ corresponding to the inner product of the input vector and the weight vector is generated.

When the capacitance of the unit computation circuit 210 is $C_t$ during the accumulation operation, the computation signal $V_{mac}$ may be expressed as Equation 2 below.

$$V_{mac} = \frac{\sum_{j=1}^{n} Q_j}{nC_t} = \frac{\sum_{j=1}^{n} C_p V_{1j} W_j}{nC_t} = \sum_{j=1}^{n} \frac{c_p}{nc_t} V_{1j} W_j \quad \text{[Equation 2]}$$

$$= \sum_{j=1}^{n} x_{1j} W_j, \; x_{1j} = \frac{c_p}{nc_t} V_{1j}$$

As described above, the computation signal $V_{mac}$ output during the accumulation operation is a signal having a value corresponding to the inner product of the input vector and the weight vector.

The computation circuit 200 may further include an amplifier 202 for adjusting and outputting the magnitude of the computation signal $V_{mac}$.

The computation circuit 200 may further include an analog-to-digital converter (ADC) 204 for converting the computation signal $V_{mac}$ into a digital signal $D_{mac}$.

Although various embodiments have been described for illustrative purposes, it will be apparent to those skilled in the art that various changes and modifications may be made to the described embodiments without departing from the spirit and scope of the disclosure as defined by the following claims.

What is claimed is:

1. A semiconductor device comprising:
   a cell array including a plurality of unit cells, the plurality of unit cells configured to store a plurality of analog voltage values corresponding to a plurality of first signals by a write operation and to output a plurality of output signals corresponding to the analog voltage values by a read operation;
   a computation circuit including a plurality of unit computation circuits, the plurality of unit computation circuits receiving the plurality of output signals and a plurality of second signals and the plurality of unit computation circuits being set to have respective capacitances according to the plurality of second signals during a computation operation; and
   a control circuit configured to control the cell array and the computation circuit during the write operation, the read operation, and the computation operation,
   wherein each of the plurality of unit cells includes:
     a cell capacitor having a first terminal which is grounded;
     a write circuit connected to a second terminal of the cell capacitor, and configured to charge the cell capacitor with a cell voltage corresponding to a value of one of the plurality of first signals during the write operation; and
     a read circuit connected to the second terminal of the cell capacitor, and configured to provide an output voltage corresponding to the cell voltage during the read operation, and
   wherein the read circuit includes a first read transistor having a gate receiving the cell voltage and a drain receiving a bias current, and a second read transistor having a gate receiving a row read signal, a drain coupled with a source of the first read transistor, and a source outputting the output voltage.

2. The semiconductor device of claim 1, wherein the write circuit includes a write transistor having a gate controlled by a row write signal and configured to provide an input current to the second terminal of the cell capacitor.

3. The semiconductor device of claim 2, wherein the cell array further comprises a column write switch for controlling the input current according to a column write signal.

4. The semiconductor device of claim 3, wherein the value of the one of the plurality of first signals during the write operation corresponds to a pulse width of the column write signal.

5. The semiconductor device of claim 1, wherein the cell array further comprises a column read switch for controlling the bias current according to a global read signal.

6. The semiconductor device of claim 1, wherein each of the plurality of unit cells further comprises a cell reset switch for discharging the cell capacitor.

7. The semiconductor device of claim 1, wherein each of the plurality of unit computation circuits stores a signal corresponding to a multiplication between one of the plurality of first signals and one of the plurality of second signals during a multiplication operation, and
   wherein the computation circuit during an accumulation operation outputs a computation signal corresponding to a sum of signals stored in the plurality of unit computation circuits during the multiplication operation.

8. The semiconductor device of claim 7, wherein each of the plurality of unit computation circuits includes a plurality of switch-capacitor pairs connected in parallel and each having a first terminal being grounded and a second terminal receiving a signal among the plurality of output signals, and
   wherein during the multiplication operation, the plurality of switch-capacitor pairs are set to have capacitance corresponding to one of the plurality of second signals.

9. The semiconductor device of claim 8, wherein during the accumulation operation, the plurality of unit computation circuits are set to have a same capacitance and then the plurality of unit computation circuits are connected in parallel.

10. The semiconductor device of claim 8, wherein the computation circuit further comprises a discharge switch configured to discharge the plurality of switch-capacitor pairs included in each of the plurality of unit computation circuits.

11. The semiconductor device of claim 7, wherein the control circuit controls the cell array to perform the read operation when the computation circuit performs the multiplication operation, and
   wherein the control circuits controls the cell array to stop performing the read operation when the computation circuit performs the accumulation operation.

12. The semiconductor device of claim 7, further comprising an amplifier configured to amplify the computation signal.

13. The semiconductor device of claim 7, further comprising an analog-to-digital converter configured to convert the computation signal into a digital signal.

* * * * *